United States Patent
Chun

Patent Number: 5,843,237
Date of Patent: Dec. 1, 1998

[54] APPARATUS FOR MANUFACTURING A SEMICONDUCTOR DEVICE HAVING A WAFER LOADING STAGE WITH AN ANNULAR SLOPE

[75] Inventor: Sang-jun Chun, Suwon, Rep. of Korea

[73] Assignee: Samsung Electronics Co., Ltd., Suwon, Rep. of Korea

[21] Appl. No.: 773,338

[22] Filed: Dec. 26, 1996

[30] Foreign Application Priority Data

Feb. 22, 1996 [KR] Rep. of Korea .................... 1996-4200

[51] Int. Cl.⁶ .................................................. C23C 16/00
[52] U.S. Cl. ................. 118/728; 156/345; 204/298.15; 118/723 R
[58] Field of Search ............... 118/723 R, 723 MW, 118/723 ME, 723 MR, 723 MA, 723 AN, 723 E, 723 I, 723 IR, 728; 156/345; 204/298.15, 298.2, 298.31

[56] References Cited

U.S. PATENT DOCUMENTS

| | | | |
|---|---|---|---|
| 4,854,263 | 8/1989 | Chang et al. ................... | 118/715 |
| 5,292,554 | 3/1994 | Sinha et al. ..................... | 427/251 |
| 5,304,248 | 4/1994 | Cheng et al. .................... | 118/728 |
| 5,456,757 | 10/1995 | Aruga et al. ................. | 118/723 E |
| 5,554,266 | 9/1996 | Okamoto ................... | 204/298.15 |
| 5,695,561 | 12/1997 | Tomiyama et al. ............. | 118/620 |

*Primary Examiner*—R. Bruce Breneman
*Assistant Examiner*—Luz Alejandro
*Attorney, Agent, or Firm*—Jones & Volentine, L.L.P.

[57] ABSTRACT

An apparatus for manufacturing a semiconductor device having a stage for loading a wafer includes: a flat horizontal main surface formed so that the wafer can be fully seated thereon; a perimeter surface formed at an outer portion of the stage and spaced at a predetermined distance from the flat main surface at a height lower than that of the flat main surface; and an annular slope formed between an outer circumference of the flat main surface and an inner circumference of the perimeter surface. The annular slope has a predetermined angle of inclination with respect to the flat main surface. The apparatus prevents the occurrence of plasma buildup and minimizes poor processing uniformity due to the buildup of polymer deposits on the stage.

2 Claims, 2 Drawing Sheets

5,843,237

APPARATUS FOR MANUFACTURING A SEMICONDUCTOR DEVICE HAVING A WAFER LOADING STAGE WITH AN ANNULAR SLOPE

BACKGROUND OF THE INVENTION

The present invention relates to an apparatus for manufacturing a semiconductor device, and more particularly, to an apparatus for manufacturing a semiconductor device having a stage for loading a wafer that minimizes poor processing uniformity.

A dry etching process using plasma or reactive ions has recently been incorporated in the manufacture of highly integrated semiconductor devices. In the dry etching process, a wafer to be etched is loaded on a stage which is placed inside a reaction chamber under vacuum. The necessary gas, e.g., $O_2$, $CHF_3$, $C_2F_6$ or He, is then injected into the reaction chamber for etching.

FIG. 1 is a top view of a conventional stage for loading a wafer that is placed in the reaction chamber of a typical dry etching apparatus.

Referring to FIG. 1, the upper portion of a stage 10 includes a flat horizontal main surface 12 such that a wafer (not shown) may be placed thereon. A first perimeter surface 14 is formed around the flat main surface 12 at a height slightly lower than that of the main surface, and a second perimeter surface 16 is formed around the first perimeter surface 14 with a height slightly lower than that of the first perimeter surface 14, such that the second perimeter surface 16 forms the outermost portion of the stage 10. An upper surface of the second perimeter surface 16 can be connected with a predetermined fitting element (not shown) for fixing the stage 10 within the chamber. Accordingly, with each of the above flat surfaces being formed horizontal and parallel with each other, the stage 10 is thus stepped between the flat main surface 12 and first perimeter surface 14, and between the first and second perimeter surfaces 14 and 16.

FIG. 2 is a section view taken along line 2–2' of FIG. 1, which shows the state in which a wafer 50 is loaded on the stage 10 within a reaction chamber of the typical dry etching apparatus. As shown in FIG. 2, a step S of a certain height is formed between the main surface 12 and first perimeter surface 14. The step S has a relatively small size, e.g., about 0.4 mm. Thus, when the wafer 50 is loaded on the stage 10, a gap G is formed between the first perimeter surface 14 and the bottom surface of the wafer 50.

When the dry etching process is performed using plasma, a buildup of plasma develops in the gap G. One disadvantage is that the plasma buildup causes a photoresist pattern (not shown) to be burnt out at an edge portion of the wafer 50, which results in undesirable etching.

Another disadvantage is that the etching process can cause by-products (polymers) to accumulate on the first and second perimeter surfaces at the edges of the stage 10. Such polymers are generated in the reaction chamber as a result of the reactions of the injected gas, the photoresist, or a film material on the wafer, such as phosphosilicate glass, nitride or oxide.

FIG. 3 shows the state in which the wafer 50 is loaded on the flat main surface 12 of the stage 10 shown in FIG. 1 after a polymer deposit 20 has accumulated on the first perimeter surface 14, to a height greater than 0.4 mm, i.e., greater than the step S and corresponding gap G in FIG. 2. Due to the presence of the polymer deposit 20, the wafer 50 cannot be properly loaded (fully seated) on the flat main surface 12, thus raising the loaded wafer and increasing the distance between the wafer 50 and a cooling system (not shown) disposed beneath the wafer in the lower portion of the stage 10. Accordingly, proper wafer cooling cannot be achieved and the higher ambient temperature in the reaction chamber burns the photoresist on the wafer 50.

As a further consequence of the polymer deposit 20, the wafer 50 is inclined which deteriorates the uniformity of the etching process. In this state, poor processing can easily occur due to the deterioration of the etching efficiency.

SUMMARY OF THE INVENTION

Accordingly, it is an object of the present invention to provide an apparatus for manufacturing a semiconductor device, having a stage for loading a wafer that maximizes etching efficiency and minimizes poor processing uniformity.

To accomplish the above object, there is provided an apparatus for manufacturing a semiconductor device comprising a stage on which a wafer is placed for processing in a reaction chamber, wherein the stage comprises: a flat main surface horizontally formed so that the wafer can be fully seated thereon; a perimeter surface formed at an outer portion of the stage, wherein the perimeter surface is spaced at a predetermined distance from the flat main surface at a height lower than the flat main surface; and an annular slope formed between an outer circumference of the flat main surface and an inner circumference of the perimeter surface, the annular slope having a predetermined angle of inclination with respect to the flat main surface.

According to the present invention, the occurrence of plasma buildup or poor processing uniformity due to the presence of a polymer deposit can be minimized.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
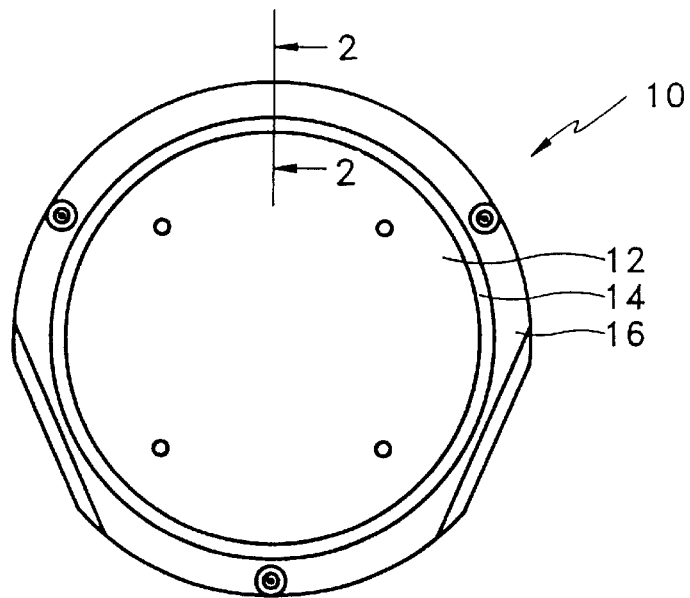
FIG. 1 is a plan view of a stage for loading a wafer of a conventional apparatus for manufacturing a semiconductor device.
Figure 2:
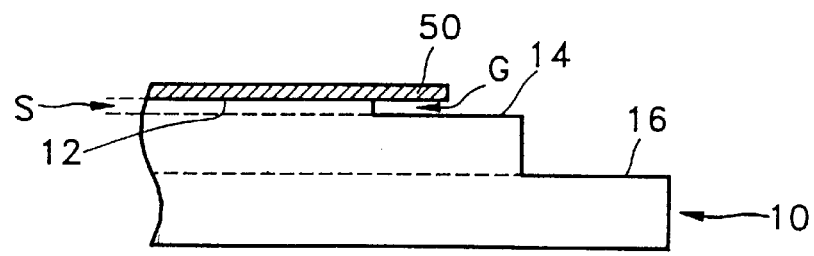
FIG. 2 is a section view taken along line 2–2' of FIG. 1.
Figure 3:
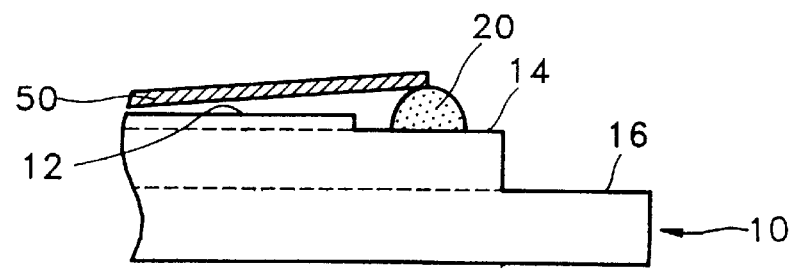
FIG. 3 is a section view taken along line 2–2' of FIG. 1, showing the state in which a wafer is loaded when a polymer deposit has accumulated on the stage.
Figure 4:
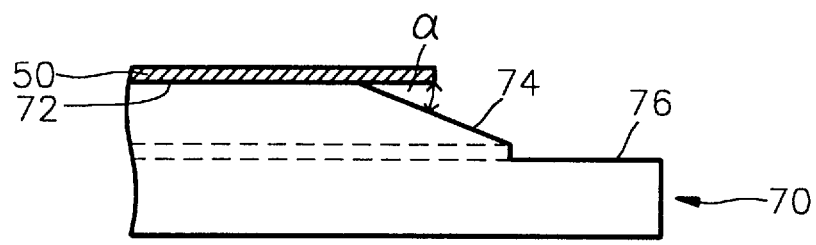
FIG. 4 is a section view of a stage for wafer loading of an apparatus for manufacturing a semiconductor device according to the present invention.

An exemplary embodiment of the invention will now be described with reference to FIGS. 4 and 5. Referring to FIG. 4, a stage 70 of an apparatus for manufacturing a semiconductor device includes a flat main surface 72, a perimeter surface 76, and an annular slope 74. The flat main surface 72 is horizontally formed so that the wafer 50 can be fully seated on an upper surface of the stage 70 during etching. The perimeter surface 76 is formed at the outermost portion of the upper surface of the stage 70 and is spaced by a predetermined distance from the flat main surface 72, at a height lower than that of the flat main surface 72. The annular slope 74 is formed between the outer circumference of the flat main surface 72 and the inner circumference of the perimeter surface 76. The annular slope 74 has a predetermined angle of inclination α with respect to the flat main surface 72. It is preferable that the predetermined angle of inclination α is at least 20°.

Figure 5:
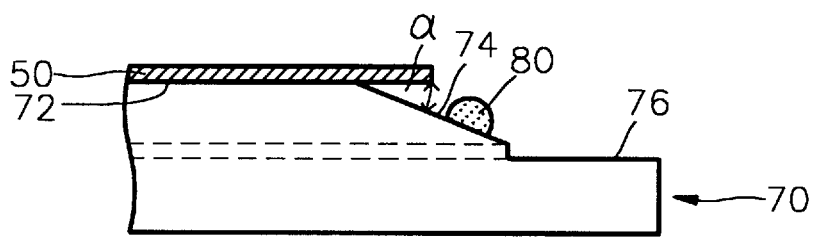
FIG. 5 is a section view showing the wafer-loading state according to the present invention in which a wafer is loaded when a polymer deposit has accumulated on the stage.

Referring to FIG. 5, since the stage 70 has the annular slope 74 inclined at an angle of at least 20° with respect to the main surface 72, even though a polymer deposit 80 is deposited on a peripheral portion of the main surface 72, and more particularly, on the annular slope 74, the growth of the polymer deposit 80 does not disrupt the position of the wafer 50. This is because with the annular slope 74, the polymer deposit 80 grows at a sufficient distance from the wafer 50, and in different direction from where the wafer 50 is loaded. Accordingly, the polymer deposit 80 does not cause the wafer 50 to become lifted, and no gap is formed which leads to a buildup of plasma between the bottom surface of the wafer 50 and the annular slope 74.

According to the present invention, plasma buildup between the wafer 50 and the stage 70 can be prevented due to the inclination of the annular slope 74. Thus, in contrast to the conventional case, an undesirable processing state due to the presence of the polymer deposit on the wafer can be prevented, and the efficiency of a process for manufacturing a semiconductor device can be enhanced accordingly.

It should be understood that the invention is not limited to the illustrated embodiment and that many changes and modifications can be made within the scope of the invention by anyone skilled in the art.

What is claimed is:

1. An apparatus for manufacturing a semiconductor device comprising a stage on which a wafer is placed for processing in a reaction chamber, said stage comprising:
    a flat main surface horizontally formed so that said wafer having a continuous surface, whereby said wafer is devoid of a hole extending therethrough, can be fully seated thereon;
    a perimeter surface formed at an outer portion of said stage, wherein said perimeter surface is spaced at a predetermined distance from said flat main surface at a height lower than said flat main surface; and
    an annular slope formed between an outer circumference of said flat main surface and an inner circumference of said perimeter surface, said annular slope being exposed to reaction chamber gases and having a predetermined angle of inclination with respect to said flat main surface.

2. An apparatus for manufacturing a semiconductor device according to claim 1, wherein said predetermined angle of inclination formed between said flat main surface and said annular slope is at least 20°.

* * * * *